United States Patent [19]
Nyseth et al.

[11] Patent Number: 6,010,008
[45] Date of Patent: Jan. 4, 2000

[54] TRANSPORT MODULE

[75] Inventors: David L. Nyseth, Plymouth; Dennis J. Krampotich, Shakopee; Todd M. Ulschmid; Gregory W. Bores, both of Prior Lake, all of Minn.

[73] Assignee: Fluoroware, Inc., Chaska, Minn.

[21] Appl. No.: 08/891,644

[22] Filed: Jul. 11, 1997

[51] Int. Cl.[7] .................................................. B65D 85/90
[52] U.S. Cl. ........................................... 206/711; 206/454
[58] Field of Search ................................. 206/213.1, 454, 206/701, 710–712; 211/41.18; 141/98; 414/217, 416

[56] References Cited

U.S. PATENT DOCUMENTS

| 324,671 | 8/1885 | Drake ...................................... 220/759 |
| D. 378,873 | 4/1997 | Gregerson et al. . |
| 4,532,970 | 8/1985 | Tullis et al. . |
| 4,676,709 | 6/1987 | Bonora et al. . |
| 4,739,882 | 4/1988 | Parikh et al. . |
| 4,815,912 | 3/1989 | Maney et al. . |
| 4,995,430 | 2/1991 | Bonora et al. . |
| 5,024,329 | 6/1991 | Grohrock . |
| 5,445,271 | 8/1995 | Kakizaki et al. . |
| 5,452,795 | 9/1995 | Gallagher et al. ...................... 206/454 |
| 5,469,963 | 11/1995 | Bonora et al. . |
| 5,482,161 | 1/1996 | Williams et al. ....................... 206/711 |
| 5,570,987 | 11/1996 | McKenna . |

FOREIGN PATENT DOCUMENTS

| 0579099 | 7/1993 | European Pat. Off. . |
| 0744765 | 5/1996 | European Pat. Off. . |
| 1006529 | 7/1997 | Netherlands . |
| WO97/13710 | 4/1997 | WIPO . |

*Primary Examiner*—Jim Foster
*Attorney, Agent, or Firm*—Douglas J. Christensen

[57] ABSTRACT

A module with an openable and closeable door has a central support structure which includes a machine interface exposed at the bottom of the module and integral wafer support columns extending upwardly in the module for supporting wafers. An advantage and feature of the invention is that a non-interrupted path-to-ground extends from each wafer support shelf to the machine interface. Additionally, the side walls of the shell have a recess portion with engagement members that cooperate with engagement members on removable handles. The handles utilize detents to rotatably lock such handles into place on the side walls of the carrier.

19 Claims, 9 Drawing Sheets

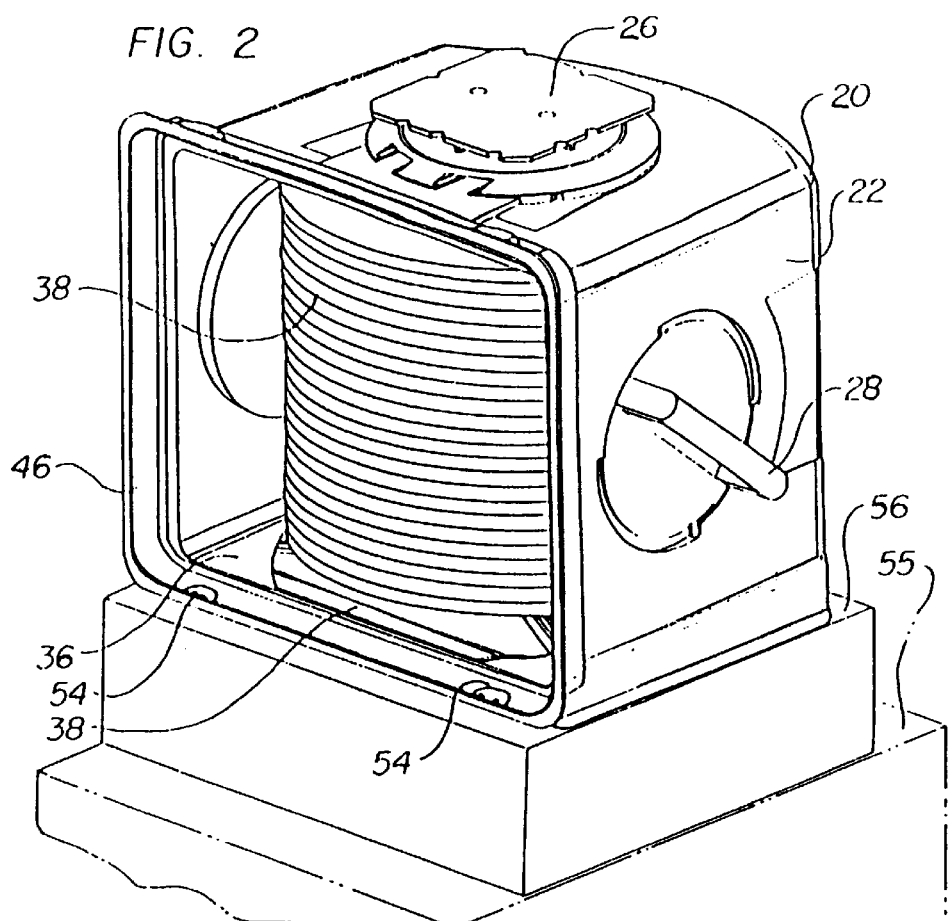
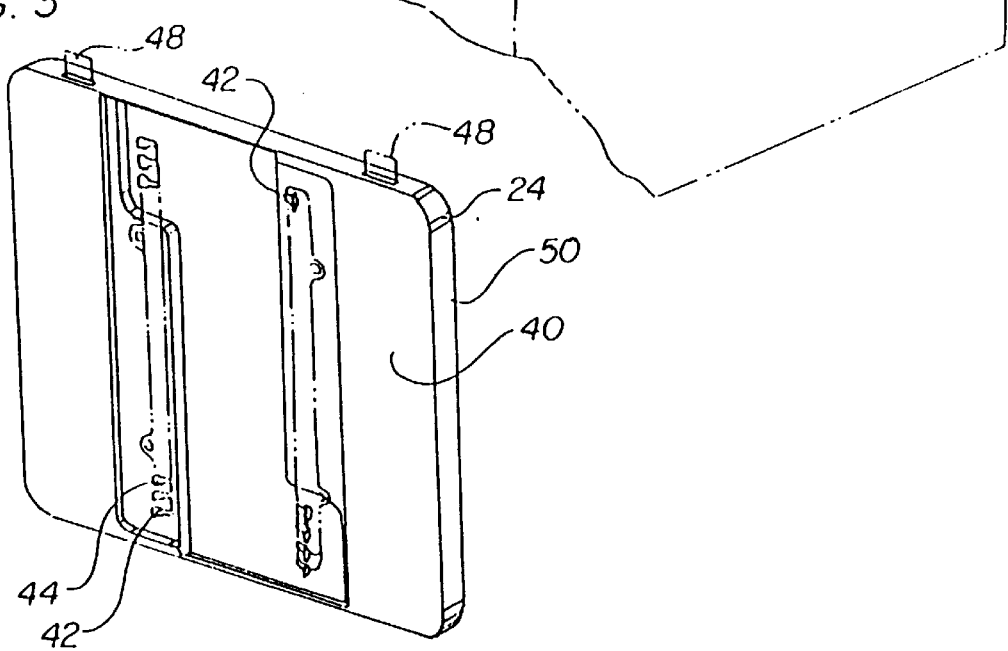

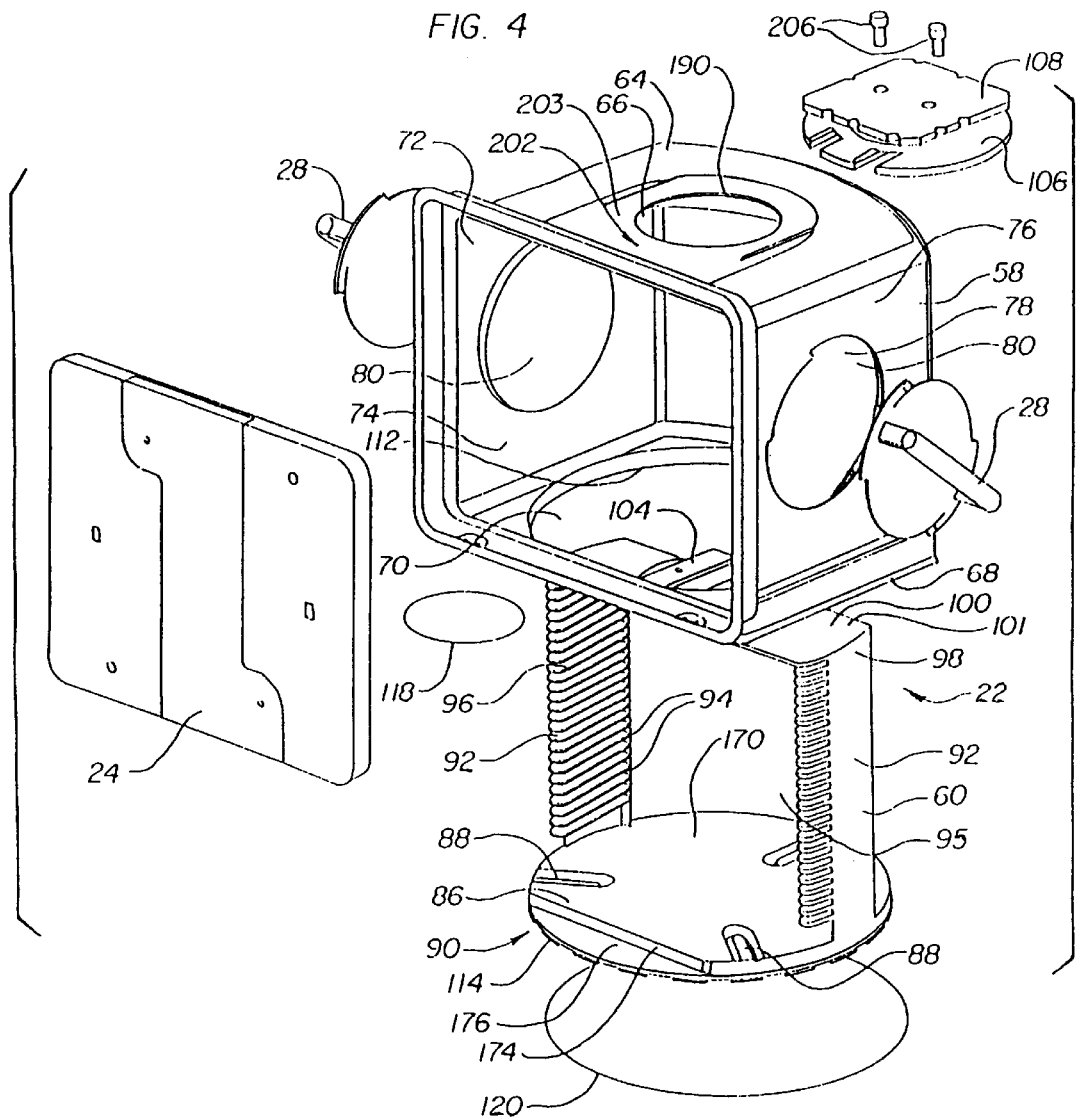

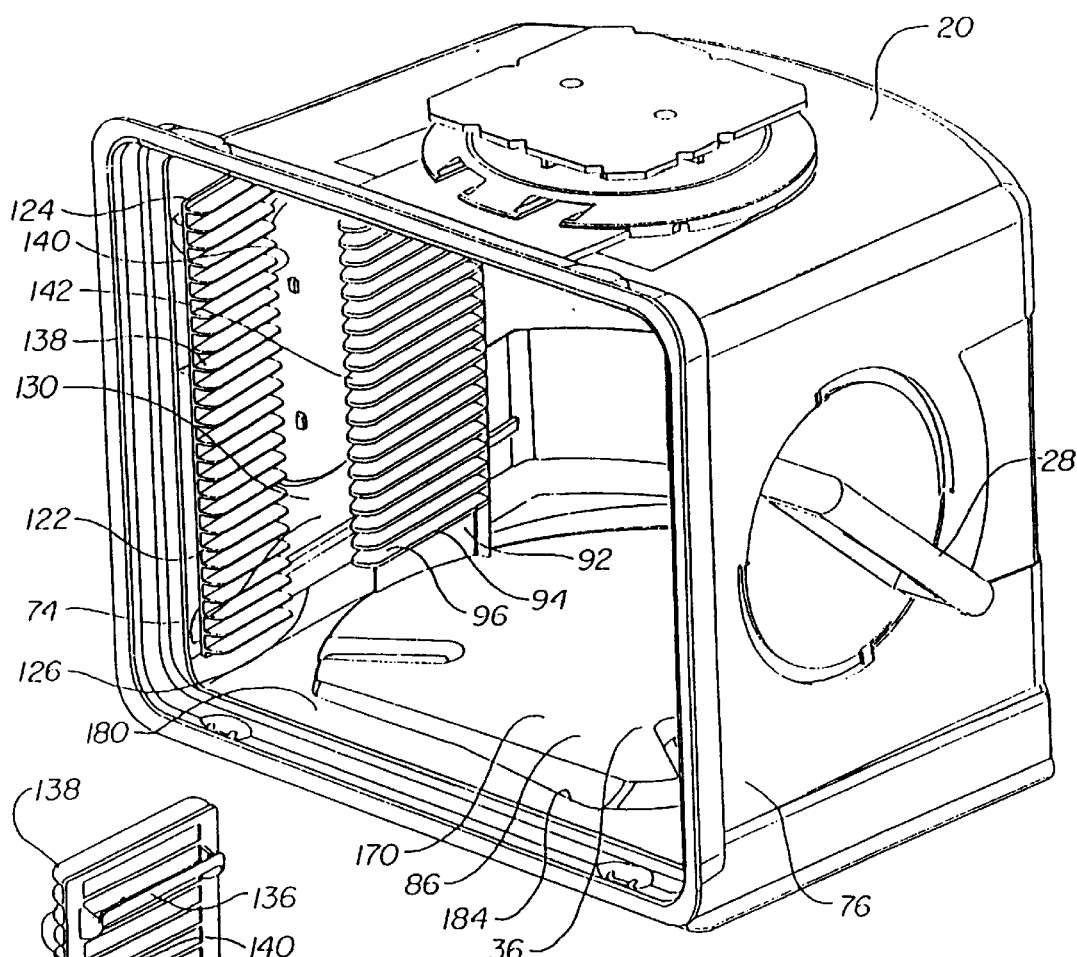

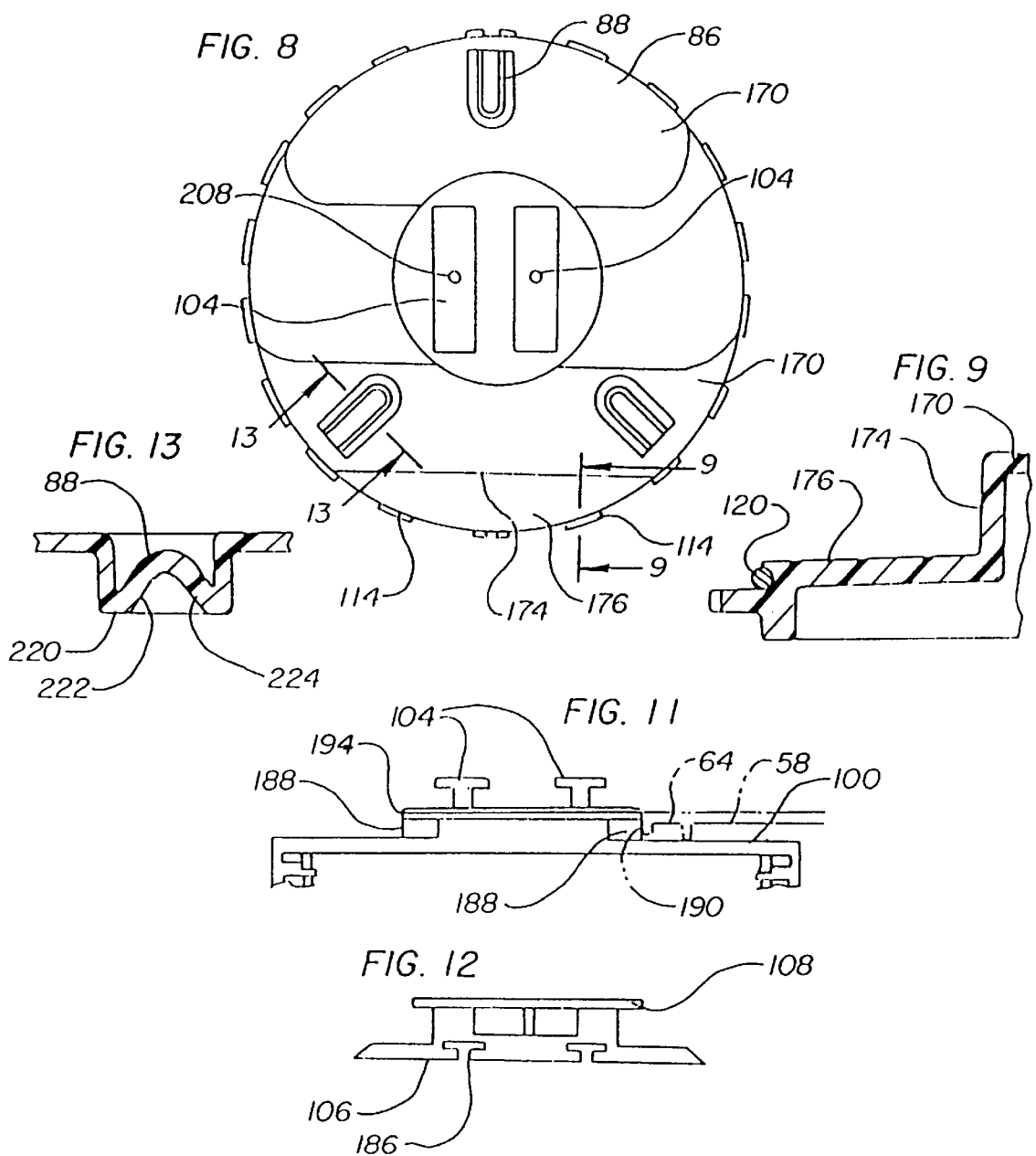

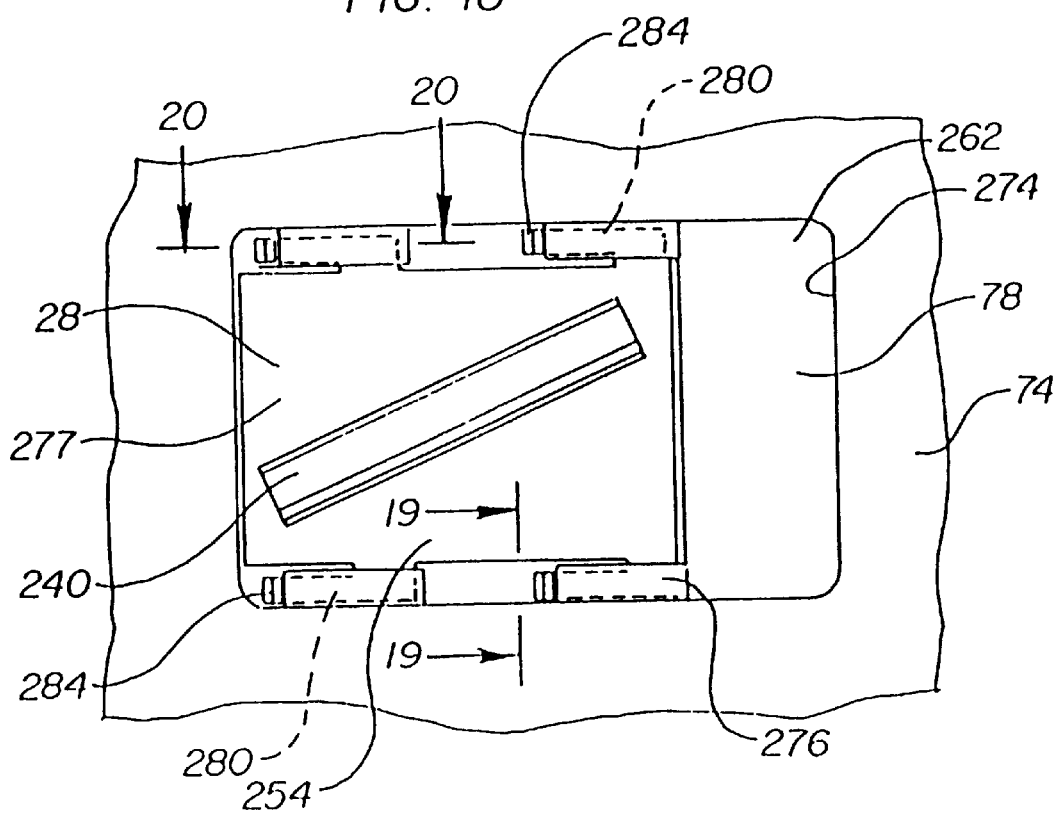
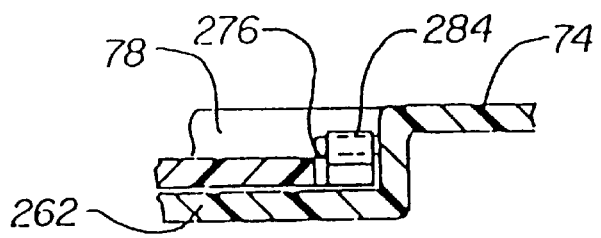
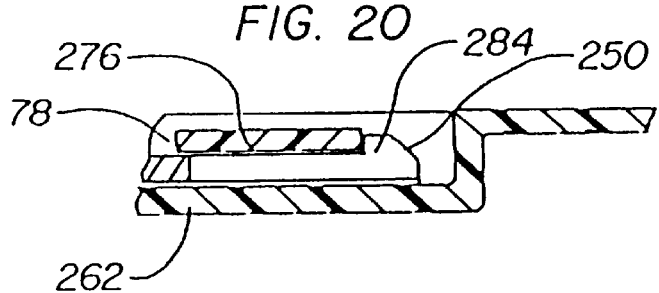

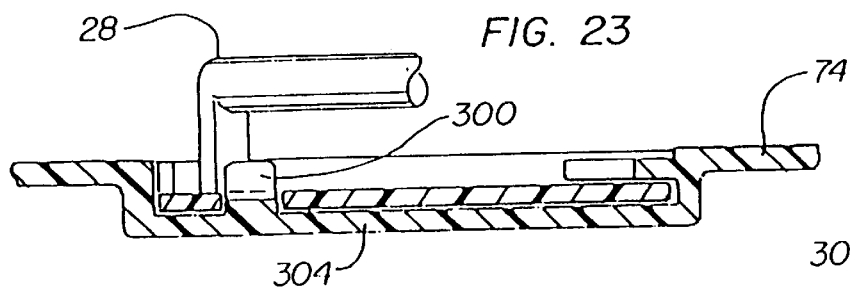
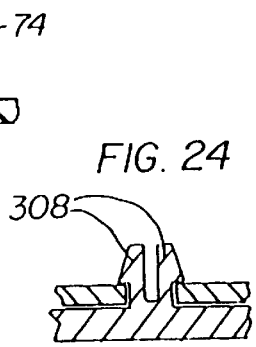
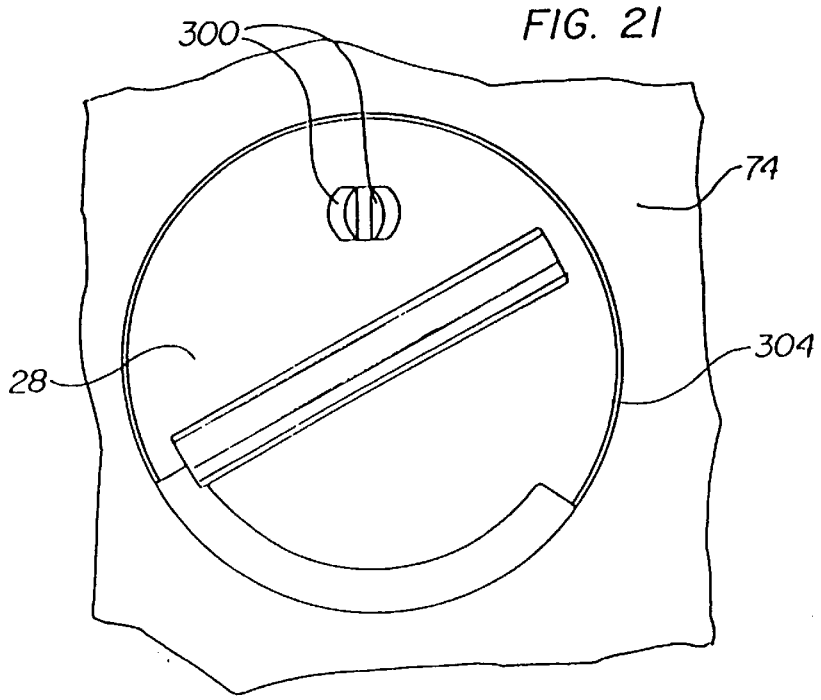
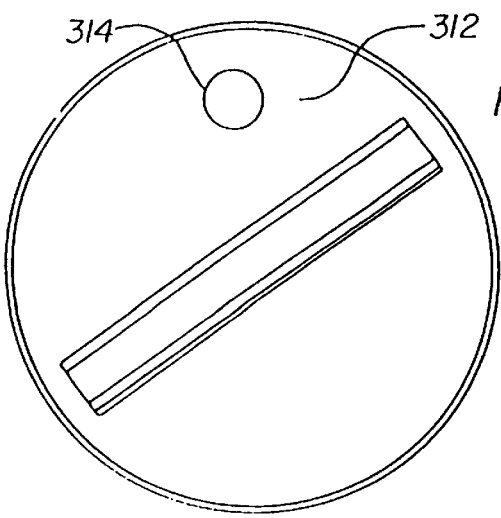

TRANSPORT MODULE

BACKGROUND OF THE INVENTION

This invention relates to carriers for semiconductor wafers and more particularly it relates to a closeable container for storing and transporting wafers.

Sealable enclosures, generally termed transport modules, have been utilized in the semiconductor processing industry for a number of years for storing and transporting wafers between processing steps and/or between facilities. Semiconductor wafers are notoriously vulnerable to damage from contaminants such as particles. Extraordinary measures are taken to eliminate contaminants in cleanrooms and other environments where semiconductor wafers are stored or processed into circuits.

For wafers in the range of 200 mm and smaller, containers known as SMIF pods (standardized mechanism interface) have been utilized to provide a clean sealed mini-environment. Examples of these pods are shown in U.S. Pat. Nos. 4,532,970 and 4,534,389. Such SMIF pods typically utilize a transparent box-shaped shell with a lower door frame or flange defining an open bottom and a latchable door. The door frame clamps onto processing equipment and a door on the processing equipment and the lower SMIF pod door closing the open bottom are simultaneously lowered downwardly from the shell into a sealed processing environment in said processing equipment. A separate H-bar carrier positioned on the top surface inside of the SMIF pod door and loaded with wafers is lowered with the pod door for accessing and processing said wafers. In such pods the weight of the wafers would be directly on the door during storage and transport.

The semiconductor processing industry is moving toward utilization of larger and heavier wafers, specifically 30 mm wafers. Transport modules for such modules, by way of developing industry standards, will utilize a front opening door for insertion and removal of the wafers as opposed to a bottom door that drops downwardly from the module. The door would not support the load of the wafers, rather a container portion which would include a clear plastic (such as polycarbonate) shell and other members for supporting the wafers molded from a low particle generating plastic (such as polyetheretherketone) would carry the load of the wafers. Such container portions necessarily are made from multiple components assembled together.

In handling and processing semiconductor wafers, static electricity is a continuing concern. Electrostatic discharges can damage or ruin semiconductor wafers. Therefore, means must be taken to minimize any such generation of potentials which may cause static electric discharges. H-bar carriers have been manufactured with conventional static dissipative materials such as carbon filled polyetheretherketone (PEEK) and polycarbonate (PC).

The developing industry standards for such 300 mm modules require a machine interface, such as a kinematic coupling, on the bottom of the module to repeatedly and with precision align the module with respect to the processing equipment. This allows robotic handling means to engage the door on the front side of the module, open the door, and with the necessary amount of precision grasp and remove specific horizontally arranged wafers. It is highly critical to have the wafers positioned at a particular height and orientation with reference to the equipment machine interface such that the wafers will not be located and damaged during the robotic withdrawal and insertion of said wafers.

Due to inconsistencies in molding plastic parts assembly of such plastic parts lead to inconsistencies, such as open cracks between parts and the stacking of the tolerances of each individual part leading to undesirable variations in critical dimensions.

Known front opening 30 mm transport modules utilize multiple component parts including multiple components between the equipment interface and the wafer supports. This can lead to difficulty in producing modules with acceptable tolerances between the wafer planes and the equipment interface. Additionally, such modules have a path to ground from the wafer shelves to the equipment interface through several different components including metallic screws.

The 30 mm wafers are substantially greater in size and weight than the 20 mm modules; therefore, a structurally stronger module for transporting batches of wafers is required. Typically with the 20 mm SMIF pods the module was simply carried manually by grasping the lower edges at the juncture of the shell door flange and the door. Handles have been provided on the top of the shell portion for bottom opening pods. For carrying the larger, heavier, and bulkier modules for 30 mm wafers side handles are appropriate. For certain applications, the movement of the 30 mm module may be exclusively by way of robotic means thus not requiring handles or other means for manually transporting the container. Thus, a robotic lifting handle should be provided and any manual lifting handles should be easily removable.

Additionally, due to the high susceptibility of wafers to contamination by particles, moisture or other contaminants it is ideal to have a minimal number of potential entry paths to the interior of the module. Paths or breaks in the plastic between the interior and exterior of the pod such as for fasteners or at the junction of separate component parts of the module are to be avoided. Any such path required should be adequately sealed.

Additionally, the use at any location in the pod of metallic fasteners or other metal parts are highly undesirable in semiconductor wafer carriers or containers. Metallic parts generate highly damaging particulates when rubbed or scrapped. Assembly of a module with fasteners causes such rubbing and scrapping. Thus, the use of transport modules requiring metal fasteners or other metal parts are to be avoided.

SUMMARY OF THE INVENTION

A front-opening wafer transport module has a container portion with transparent shell and a central support structure which includes a machine interface exposed at the bottom of the module and integral wafer support columns extending upwardly in the container portion for supporting wafers. Additionally, the side walls of the shell have recessed portions with engagement members that cooperate with engagement members on removable handles. The handles utilize detents to lock into place in the recesses on the side walls of the carrier. Attachment of the handles to the side walls is accomplished without breaks between the interior and exterior of the module.

A feature and advantage of the invention is that there are no stacking of tolerances among parts relative to the machine interface level and the levels of the wafers on the wafer shelves. Where multiple components define the machine interface level and the wafer levels, each part has a separate manufacturing tolerance and when such components are assembled into the module the tolerances are cumulative. This translates into a higher rejection of individual parts and/or a higher rejection level of assembled modules. The instant invention utilizes a single integral component for the machine interface and the wafer support members.

Another advantage and feature of the invention is that a non-interrupted path-to-ground extends from each wafer support shelf to the machine interface.

Another object and advantage of the invention is that the central support structure which holds the wafers is assembled into the shell through a lower opening and is secured in place by a rotation of the central support structure with respect to the shell. No metallic fasteners are used.

Additionally, the central support structure engages and locks at the top of the shell by way of a top portion with a collar that extends into an aperture in the top of the shell and robotic lifting flange that slidably engages the top portion of the central support structure and also thereby non-rotatably locks the support structure to the shell. Again, no metallic fasteners or components are used.

Another object and advantage of the invention is that the breaks or openings in the module between the interior and exterior are sealed such as by elastomeric seals. The breaks or openings other than at the front door are circular in shape and are sealed such as by O-rings.

Another object and advantage of the invention is that handles may be easily added and removed to the module without utilizing metallic fasteners or other separate fasteners and without breaks or openings in the solid side walls.

Another object and advantage of the invention is that the component parts may be easily disassembled for cleaning and/or replacement for maintenance.

BRIEF DESCRIPTION OF THE DRAWINGS

FIG. 2 is a perspective view of the container portion of a transport module embodying the invention.

FIG. 3 is a perspective view of the inside facing cover of the door for the transport module embodying the invention.

FIG. 4 is an exploded view showing the various component parts of a transport module.

FIG. 5 is a perspective view of a container portion of the transport module.

FIG. 6 is a perspective view of a guide-in structure.

FIG. 8 is a top plan view of the central support structure.

FIG. 9 is a cross-sectional view taken at line 9—9 of FIG. 8.

FIG. 11 is a front elevational view of the top portion of the central support structure.

FIG. 12 is a front elevational view of the second connecting member including the robotic flange.

FIG. 13 is a cross-sectional view taken at line 13—13 of FIG. 8.

FIG. 18 is an elevational view of an alternative embodiment of the invention focusing on the handle and recess for receiving the handle.

FIG. 19 is a cross-sectional view taken at line 19—19 of FIG. 18.

FIG. 20 is a cross-sectional view taken at line 20—20 of FIG. 18.

FIG. 21 is a side elevational view of a portion of the module showing an alternative embodiment of the handle.

FIG. 22 is a side elevational view of the handle.

FIG. 23 is a cross-sectional view taken at line 23—23 of FIG. 21.

FIG. 24 is a cross-sectional view taken at line 24—24 of FIG. 21.

DETAILED SPECIFICATION

Figure 1:
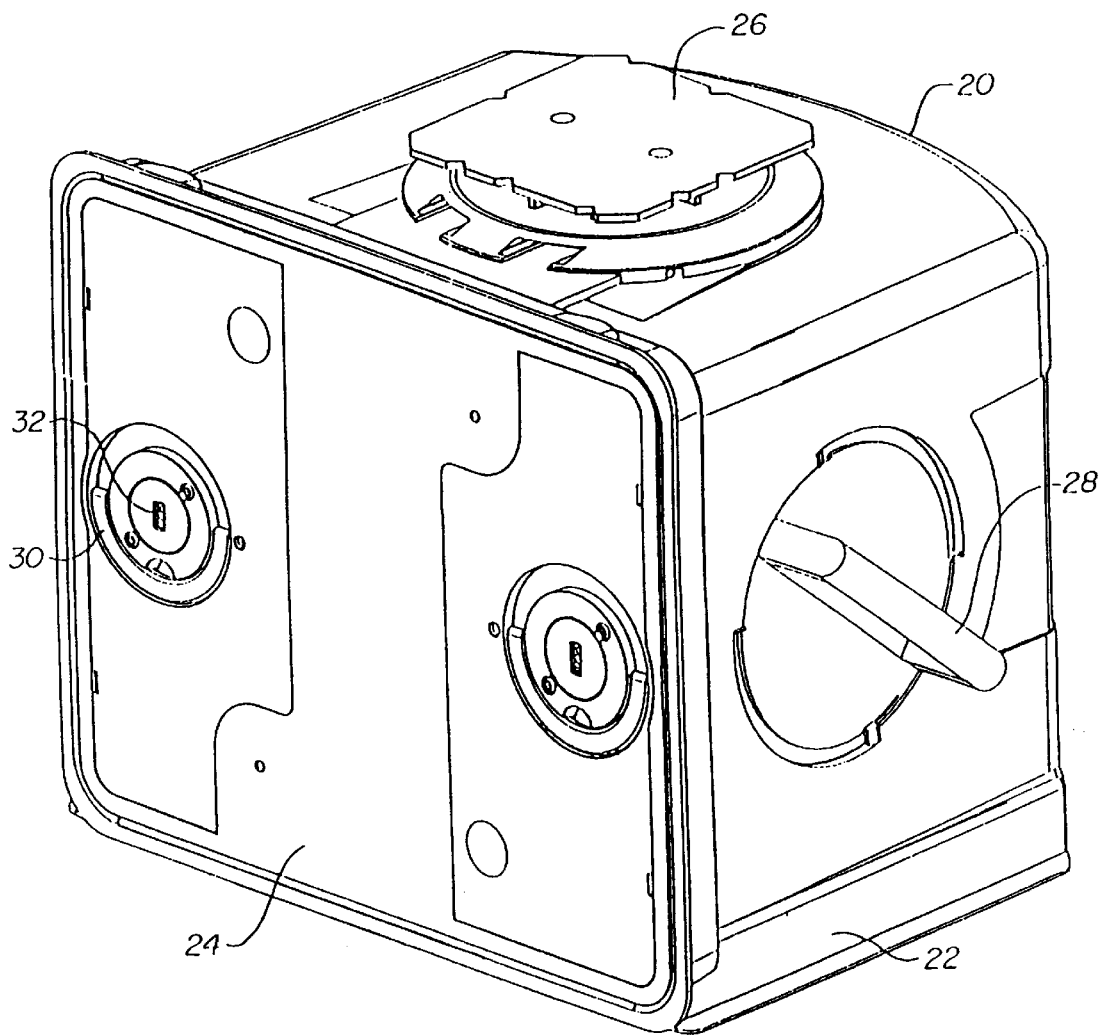
FIG. 1 is a perspective view of a transport module plotting the invention.
Figure 7:
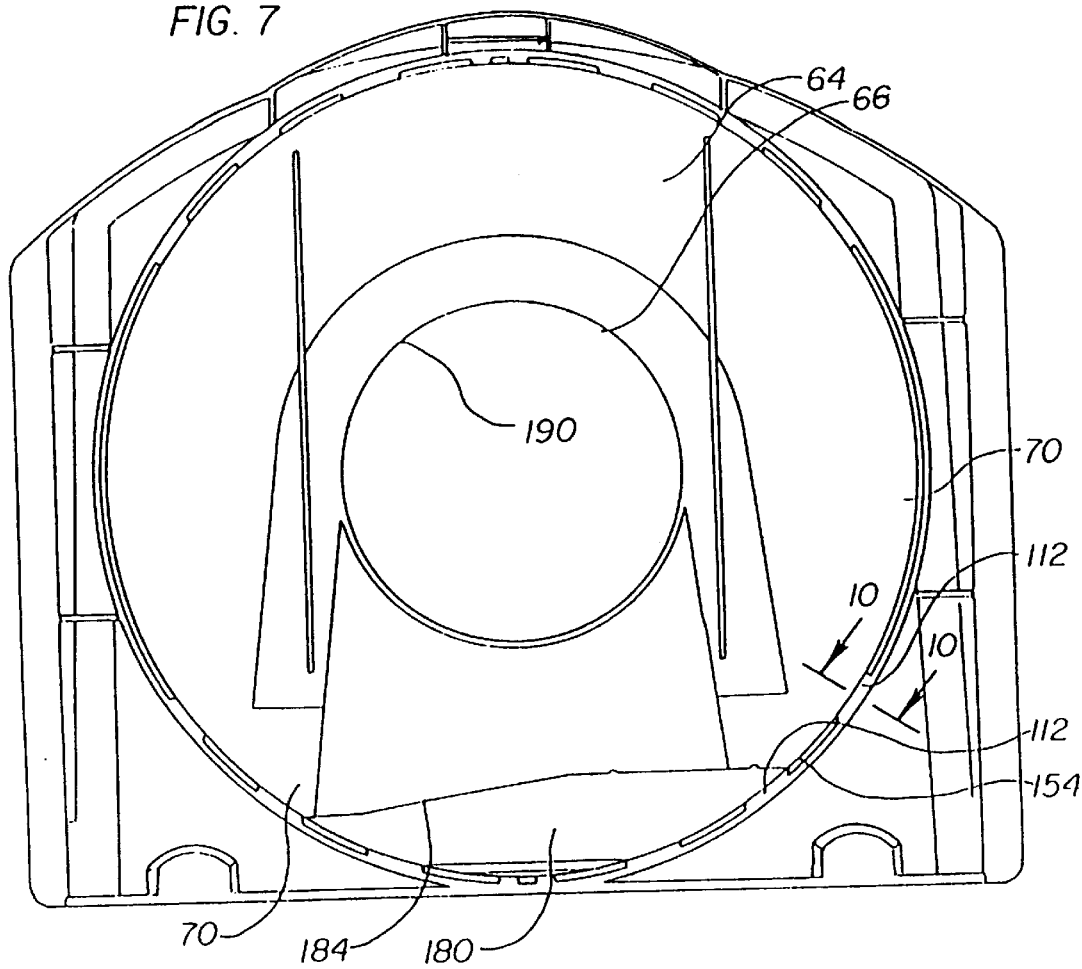
FIG. 7 is a bottom view of the shell of the container portion.
Figure 10:
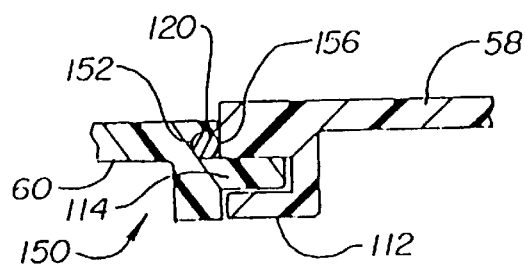
FIG. 10 is a cross-sectional view taken at line 10—10 of FIG. 7.
Figure 14:
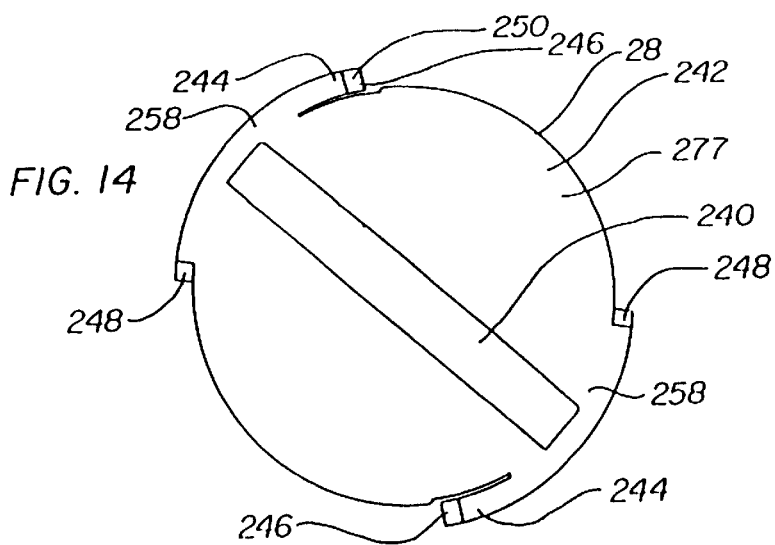
FIG. 14 is a front elevational view of the handle.
Figure 15:
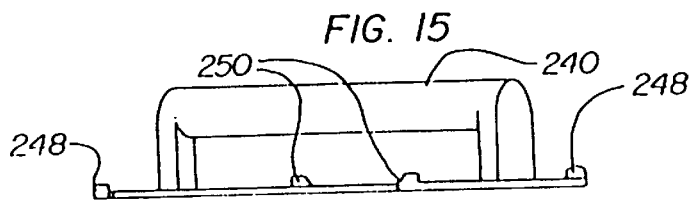
FIG. 15 is a side elevational view of the handle.
Figure 16:
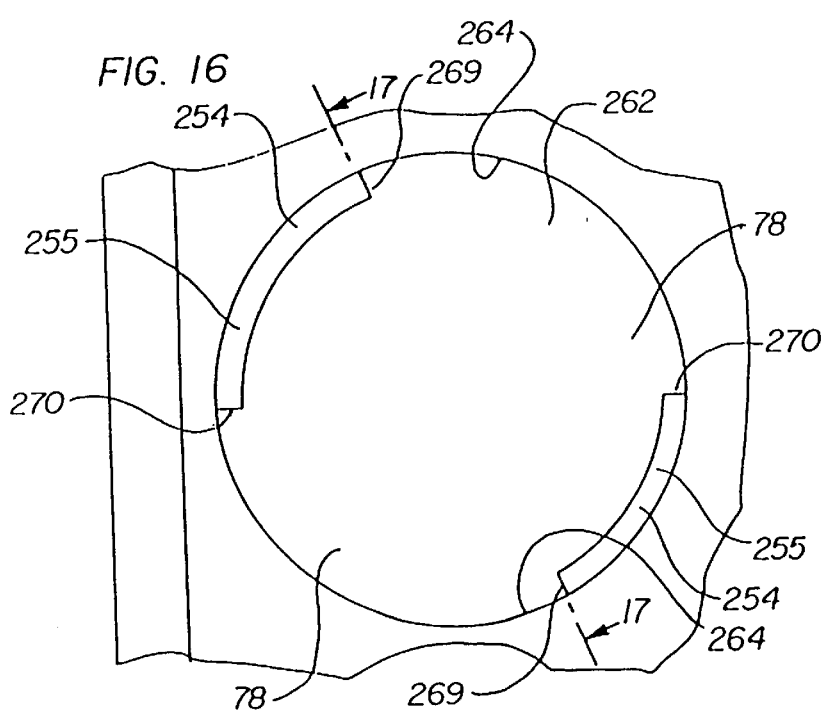
FIG. 16 is a side elevational view of a portion of the shell showing the recess for the handle.
Figure 17:
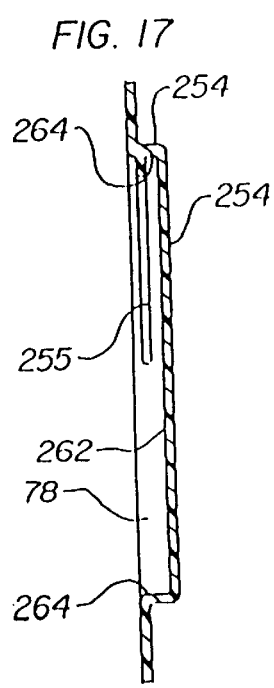
FIG. 17 is a cross-sectional view taken at line 17—17 of FIG. 16.

Referring to FIGS. 1, 2, and 3 a composite transport module for wafers generally designated with the numeral 20 is principally comprised of a container portion 22 and a door 24. The container portion includes a robotic lifting flange 26 and manual lifting handles 28. The door 24 has manual opening handles 30 and a key slot 32 which provides capability of being opened by way of robotic means. FIG. 2 shows the container portion and its open interior 36 with a plurality of wafers 38 shown supported and axially arranged in said open interior. FIG. 3 shows the inside surface 40 of the door. The door has a pair of wafer restraints 42 which engage and restrain the wafers when the door is in place. The wafer retainers are formed of flexible teeth 44 which are of resilient molded plastic. The door 24 fits within a door flange 46 on the container portion 22 and utilizes latches 48 which extend and retract from the door enclosure 50 to engage recesses 54 in the door flange. The door has a pair of internal latch mechanisms not shown in this view which operate independently of each other and by way of the manual door handle 30 or key slot 32. FIG. 3 is also depicts a piece of processing equipment 55 with a module interface portion 56 on which the transport module 20 is engaged.

Referring to FIG. 4, an exploded perspective view of the transport module which shows details of the construction and the various component parts. The container portion 22 is comprised principally of a shell 58 and a central support structure 60.

The shell 58 has a top 64 with an aperture 66, a bottom 68 with a lower opening 70, an open front side 72, a left side wall 74, and a right side wall 76 both with handle receiving portions configured as recesses 78 extending inwardly. Notably, the recesses project into the interior but have no cracks, breaks, openings or apertures between the interior 74 and the exterior of the container. The sidewalls are continuous and solid. The handle receiving portions include a recessed planar portion 80 which is part of the side walls.

The central support structure 60 is comprised of a bottom portion with an equipment interface 86 configured as a plate with three interface structures 88 which comprise a kinematic coupling. Integral with the machine interface portion 86 are a pair of wafer support columns 92 each of which comprise a plurality of shelves 94 and defining a wafer receiving region 95. Each shelf having wafer engagement portions 96. The wafer support columns 92 are integral with a top portion 100 which includes a spanning member 101 which extends between the tops 98 of the support columns 92 and also includes a first connecting member 104.

The central support structure 60 assembles upwardly into the lower opening 70 of the shell 58 with the first connecting member extending upwardly through the aperture 66 on the top 64 of the shell 58. The second connecting member 106 slidably engages on the first connecting member 104 for retention of the central support structure in the shell. A second connecting member 106 which is integral with a robotic lifting handle 108 configured as a flange. The shell also includes first engagement members 112 as part of a support structure engagement portion 113 which engage with second engagement members 114 as part of a shell engagement portion 115 on the central support structure. These cooperating engagement members also secure the central support structure to and within the shell. A first O-ring 118 engages between the top portion 100 of the central support structure and the top 64 of the shell to create a seal thereabout. Similarly, a second O-ring 120 seals between the machine interface portion 86 and the bottom 68 of the shell. Referring to FIG. 5, the transport module 20 with the door 24 removed reveals the open interior 36 and the various interior structures. This particular embodiment utilizes a guide-in structure 122 which engages with rails 124, 126 on the interior surface 130 of the side walls 74, 76 and integral with same. Shown in FIG. 6 each guide-in structure utilizes elongate engagement members 136 to fit within the rails 124, 126. The guide-in structure 122 includes teeth 138 which define slots 140 which are substantially parallel to and correlate with each of the slots 142 as defined by the shelves 94 of said wafer support columns 92. Typically the guide-in members are intended to be used when there is manual insertion of the wafers as opposed to robotic insertion. The guide-in structures 122 can also be expanded to support each wafer during more of each wafer's travel into and out of the transport module.

As shown best in FIGS. 4, 5 and 8, the lower portion of the central support structure includes a machine interface plate 86 which has a planar top surface 170 and a step 174 down to a lower planar surface 176. Note that the lower planar surface confronts the inwardly-extending portion 180 of the bottom 68 of the shell 58. Note that this inwardly-extending portion 180 does not extend uniformly as a chord across the lower generally circular opening 70; rather a further inset portion 184 allows the central support structure 60 to be put in place slightly rotated off the fully aligned position to provide for the insertion of the second engagement members into position intermediate the first engagement member 112 on the shelf. The central support structure 60 can then be partially rotated to the assembled position as shown in FIG. 5.

Referring to FIGS. 4, 8, 11 and 12, details of the elements and components which comprise the connection between the top portion 100 of the central support structure 60 and the shell 58 are shown in detail. The top portion 100 has a pair of first connecting members 104 which have a generally T-shaped cross section as best shown in FIG. 11. The first connecting members 104 engage with and fit into slots 186 also having a T-shaped cross section in the second connecting member 106 which is part of the robotic lifting flange 108. After the central support structure 60 is inserted into place in the shell 58 and rotated to the proper alignment position, the collar or neck 188 of the top portion 100 will extend through the aperture 66 and will confront the inner edge 190 which defines said aperture. The smaller O-ring 118 fits into the O-ring groove 194 on said neck 188 and creates a seal with the shell at the inner edge 190. The phantom line of FIG. 11 shows the relationship of the top 64 of the shell 58 as it confronts the neck 188 of the top portion of the central support structure 60. Thus, when the second connecting member 106 is engaged with the first connecting members 104, the top 64 of the shell 58 is sandwiched between said first engagement member 106 and the top portion 100 of the central support structure. The second connecting member 106 may be locked in place on the first connecting members 104 by way of an appropriately positioned detent or nub 202 such as shown in FIG. 4 on the top surface 203 of the top of the shell 58. Alternatively or additionally, screws 206 may be utilized which would extend through the robotic pick-up flange 108 through the second connecting member 106 and into the threaded holes 208 in the first connecting members 106. The screws are appropriately nylon as opposed to a metallic material.

The equipment interface 86 as best shown in FIGS. 4, 5 and 8, includes a kinematic coupling 90 formed by way of the equipment engagement portion 88. Referencing FIG. 13 which is a cross section through one such structure, the lower surface 220 includes a pair of angled faces 222, 224 defining a groove 225 which would engage partial, spherical surfaces on the equipment, not shown. Alternatively, the interface portion of the central support structure 60 could include said three partial spheres and the cooperating equipment include the grooves formed by angled faces. Alternatively, the equipment interface 86 could include alternate configurations and features to interface with the associated equipment.

Referring to FIGS. 2, 14, 15, 16, and 17, details of the construction and assembly of the removable manual lifting handles 28 are shown. The handle comprises a gripping portion 240 and a shell engagement portion 242. The shell engagement portion utilizes resilient portions 244 with detents 246 and stops 248. The detents 246 have a wedge portion 250 which facilitates installation of the handle into the recesses 78 and rotation under the second engagement structures 254 on the shell 58. The said second engagement structures comprises a pair of inwardly-extending members 255 configured as guide strips which correspond to the extended portion 258 on the handle engagement portion 242 when said handle is in a locked position in said recess 78. In such a locked position, the detents 246 and the stops 248 are at opposite ends of the guide strips 255. The recess 78 is defined by way of a planar portion 262 integral with a circumferential recess wall configured as a ring-shaped portion 264 which is integral with the shell. The guide members 255 are integral with and extend from said ring portion 264. Said configuration allows easy installation simply by placement of the handles 28 into the recesses 78 shown in FIG. 16 with the outwardly-extending portions positioned intermediate the guide members 255 and then rotating in a clockwise direction said handle with the first engagement structure whereby the extending portions 258 including the detent 246 rotate underneath the guide members 255 until the detents 246 snap into place at their seating positions 269 at which point the stops 248 are in their respective seating positions 270.

Significantly, this particular configuration allows easy installation and removal of the handle such as for cleaning or storage or when a robotic application does not require use of the handle. Additionally, the integrity of the separation between the interior of the transport module and the exterior is not affected. In other words, there are no breaks, openings or fasteners through the side walls to accomplish the connection of the handle to said shell.

Referring to FIG. 18, engagement structure 275 includes an alternative embodiment of the removable handle 28 is shown. This embodiment again utilizes a recess 78 extending inwardly in the side wall 74 with a planar portion 262 at the bottom of said recess. A recess wall or border portion 274 extends around and defines said recess and is integral with the planar portion 262 and the side wall 74. First engagement member 276 configured as four tabs extending inwardly from the recess wall 274. The manual lifting handle 28 comprises a gripping portion 240 and the engagement portion 254 which includes planar portion 277 with resiliently-flexible portions with detents 284. The manual handle 28 is inserted into the recess 78 such that the resilient portions 280 are placed intermediate the tabs 276 and the handle is then slid to the left such that the detents extend under said tabs and slide until they reach their locking position as shown in FIG. 18. Again this configuration does not breach the integrity of the side wall separating the interior of the transport module from the exterior. Other configurations are also available for utilization of the handle with cooperating engagement members utilizing detents. The use of the detents provides a high level of flexibility in placement and removal of the handles and allows exchange of different sizes of handles, for example, for different operators.

The shell portion of the material is preferably injection molded from polycarbonate or polyetherimide or the like. The central support structure is also ideally integrally injection molded and may be formed from carbon fiber filled PEEK or similar materials, ideally which provide a static dissipative feature. The handles may be injection molded from polycarbonate or polyetherimide. The top second connecting member including the robotic lifting handle may be also formed from carbon fiber filled PEEK or other static dissipative injection molded material.

The mechanisms utilized for latching the doors can be varied and may be such as shown in U.S. Pat. No. 4,995,430 to Anthony C. Bonora et al, or similar mechanisms.

Referring to FIGS. 19 and 20, cross-sectional views are taken through the shell and handle member as shown in FIG. 18. Note the detent 284 includes a wedge-shaped portion 250 to aid insertion under the engagement member 276. Referring to FIGS. 21, 22, 23, and 24, various views are shown of an additional embodiment of the handle member and the cooperating engagement structure of the shell. In this particular embodiment the detent members 300 extend normally from the recessed planar portion 304 and thus normally from the side wall of the shell. The detent members generally comprise a pair of angled or wedge-shaped portions 308 sized to fit into a cooperating second engagement member 312 utilizing a circular aperture 314.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

We claim:

1. A transport module for wafers having a top, a bottom, and open interior, and an open front for insertion and removal of wafers, the module comprising:
   a) a shell having a left side wall, a right side wall, an open front, and a bottom with at least one lower opening;
   b) a central support structure comprising at least two columns of wafer support shelves to support wafers in an axially aligned stacked relationship and a lower equipment engagement portion integral with the two columns and exposed through said lower opening, said wafer support shelves fixed with respect to the shell in the open interior of the shell and defining a wafer receiving region; and
   c) a door for closing the open front of the module.

2. The transport module of claim 1, wherein the shell has a top having an opening sized for receiving the central support structure, and wherein the central support structure is assembled into the transport module through said opening.

3. The transport module of claim 1, wherein: said lower opening is sized for receiving the central support structure, the central support structure is assembled into the transport module through said lower opening; the shell includes a first engagement member; the central support structure has an integral equipment interface including the equipment engagement portion; and the equipment engagement portion has an integral second engagement member cooperating with said first engagement member whereby the central support structure is secured in said shell.

4. The transport module of claim 1, wherein the central support structure is fixed to the shell at the top and adjacent the lower opening in the bottom.

5. A transport module for wafers having a top, a bottom, and open interior, and an open front for insertion and removal of wafers, the module comprising:
   a) a shell having a left side wall, a right side wall, an open front, and a bottom;
   b) a central support structure comprising at least two columns of wafer support shelves to support wafers in an axially aligned stacked relationship and a lower equipment engagement portion connecting with the two columns,
   c) a door for closing the open front of the module.
   d) a pair of handles rotatably engageable and disengageable to the shell and extending from the right side and left side of the shell.

6. A transport module for wafers having a top, a bottom, and open interior, and an open front for insertion and removal of wafers, the module comprising:
   a) a shell having a left side wall, a right side wall, a top wall, an open front, and a bottom;
   b) a central support structure comprising at least two columns of wafer support shelves to support wafers in an axially aligned stacked relationship;
   c) a door for closing the open front of the module;
   d) a handle rotatably engageable and disengageable to the shell at one of said walls;
   wherein the handle engages the shell without utilizing any openings through said wall.

7. A wafer transport module having an open interior and an open front for insertion and removal of wafers, the module comprising:
   a) an outer shell having a top with an aperture, a bottom with a bottom opening with a periphery, and an open interior,
   b) an integral central support structure having a top portion and a bottom portion having a machine interface, the central support engaged with the shell at the aperture and at the bottom opening, the central support structure having a downward facing machine interface, and
   c) a door for closing the open front.

8. The transport module of claim 7 further wherein the aperture is substantially circular and wherein the transport module further comprises a first elastomeric seal at the aperture for sealing between the shell and the top portion of the central support structure.

9. The transport module of claim 8 wherein the bottom opening is substantially circular and wherein the transport module further comprises a second elastomeric seal at the bottom opening for sealing between the shell and the lower portion of the central support structure.

10. The transport module of claim 7 further comprising a pair of wafer support columns in the interior of the module, said wafer support column integral with the central support structure.

11. The transport module of claim 7, further comprising a first O-ring and wherein the shell and top portion are sealed by way of said O-ring.

12. The transport module of claim 7 wherein the lower portion of the central support structure and the shell are rotatably secured together.

13. A wafer transport module comprising a top, a bottom, a front side with a door opening, a left side wall, a right side wall, a door sized to close the door opening, and a pair of handles, the left side wall and the right side wall each having a first engagement structure thereon, each handle having a cooperating second engagement structure slidably engageable and disengageable with one of said first engagement structures whereby each of said handles is placeable and removable from the right and left sides of said module without utilizing any openings in said right and left walls, and wherein each first engagement structure and each respective cooperating second engagement structure comprise a detent whereby said first engagement structure and said second engagement structure are slidably engageable in a rotational direction with respect to the first engagement structure.

14. The transport module of claim 13, wherein each of the first engagement structures comprise an inwardly-extending recess in each of the respective left and right side walls.

15. A transport module comprising:
   a) a shell having a top with an aperture, a front with a front opening for receiving and withdrawing of wafers, and an open interior;
   b) a door for closing the open front;
   c) a central support structure comprising a plurality of columns of wafer supports positioned to support the wafers in the open interior and a top portion integral with the plurality of column of wafer supports and engaged with the shell at the aperture; and
   d) a robotic pickup handle connecting to said top portion at said aperture and extending above said shell.

16. A transport module comprising:
   a) a shell having a top, a front with a front opening for receiving and withdrawing of wafers, and an open interior;
   b) a door for closing the open front;
   c) a central support structure comprising a plurality of columns of wafer supports positioned to support the wafers in the open interior and an integral top portion engaged with the shell at the top;
   d) a robotic pickup handle connecting to said top and extending above said shell,
   wherein the shell further comprises a lower opening, wherein the central support structure further comprises an equipment engagement portion exposed downwardly at said lower opening, wherein the shell is secured to the central support structure at said lower opening, and wherein the equipment engagement portion is integral with the columns of wafer supports.

17. A composite transport module comprising a container portion with an open interior and an open front for insertion and removal of wafers, a closed left side wall and a closed right side wall, the container portion further comprising an equipment interface integral with at least one wafer support column, the equipment interface and wafer support column separately molded from the left side wall and the right side wall, the transport module further comprising a door for closing the open front, and wherein the container portion comprises a transparent shell and wherein the top of the shell has an aperture and the transport module further comprises a top portion extending into the aperture and integral with the wafer support column.

18. The composite transport module of claim 17 further comprising a elastomeric seal engaged between the top portion and the shell at said aperture.

19. The composite transport module of claim 17, further comprising a robotic lifting flange in a connecting relation with the top portion, the lifting flange extending above the shell.

* * * * *

UNITED STATES PATENT AND TRADEMARK OFFICE
CERTIFICATE OF CORRECTION

PATENT NO. : 6,010,008
DATED : January 4, 2000
INVENTOR(S) : Nyseth et al.

It is certified that error appears in the above-identified patent and that said Letters Patent is hereby corrected as shown below:

Column 2,
Lines 6, 14, 22, and 23, please delete the numeral "30" and insert in its place -- 300 --.
Lines 15, and 17, please delete the numeral "20" and insert in its place -- 200 --.

Signed and Sealed this

Fourth Day of December, 2001

Attest:

NICHOLAS P. GODICI
Attesting Officer    Acting Director of the United States Patent and Trademark Office